US011746943B2

(12) United States Patent
Chang

(10) Patent No.: US 11,746,943 B2
(45) Date of Patent: Sep. 5, 2023

(54) JOINT ASSEMBLY

(71) Applicant: COOLER MASTER CO., LTD., New Taipei (TW)

(72) Inventor: Ting-Jui Chang, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 17/194,750

(22) Filed: Mar. 8, 2021

(65) Prior Publication Data
US 2022/0026005 A1 Jan. 27, 2022

(30) Foreign Application Priority Data
Jul. 22, 2020 (TW) .................................. 109209381

(51) Int. Cl.
F16L 43/00 (2006.01)
F16L 33/03 (2006.01)
H05K 7/20 (2006.01)

(52) U.S. Cl.
CPC .............. *F16L 43/00* (2013.01); *F16L 33/03* (2013.01); *H05K 7/20272* (2013.01); *H05K 7/20781* (2013.01)

(58) Field of Classification Search
CPC ......... F16L 43/00; F16L 33/03; F16L 33/225; F16L 37/098; H05K 7/20272; H05K 7/20781
See application file for complete search history.

(56) References Cited

U.S. PATENT DOCUMENTS

| 4,343,498 | A | * | 8/1982 | Campanini | ......... F16L 27/0816 285/272 |
| 4,632,435 | A | * | 12/1986 | Polyak | ...................... B25B 7/02 285/179 |
| 4,893,848 | A | * | 1/1990 | Melcher | ................ F16L 33/213 285/259 |
| 6,231,085 | B1 | * | 5/2001 | Olson | ...................... F16L 33/24 29/451 |
| 6,270,125 | B1 | * | 8/2001 | Rowley | ................. F16L 33/225 285/133.11 |
| 6,416,085 | B1 | * | 7/2002 | Markovic | ............. F16L 33/225 285/104 |
| 6,554,323 | B1 | * | 4/2003 | Salomon-Bahls | .. F16L 37/0927 285/239 |

(Continued)

FOREIGN PATENT DOCUMENTS

CN 102797931 A 11/2012
CN 208237299 U 12/2018

*Primary Examiner* — James M Hewitt, II
(74) *Attorney, Agent, or Firm* — Maschoff Brennan

(57) ABSTRACT

A joint assembly configured to be connected to a tube and including a first joint, a second joint and an engagement sleeve. The first joint has a channel and an engagement recess. The engagement recess is located in the channel of the first joint. The second joint has a first end, a second end and a channel. The second end is opposite to the first end. The channel of the second joint extends from the first end to the second end. The first end of the second joint is inserted into the tube. The engagement sleeve is sleeved on the tube. The tube is at least partially clamped by the engagement sleeve and the first end of the second joint. The engagement sleeve has an engagement structure located at an end of the engagement sleeve.

6 Claims, 7 Drawing Sheets

(56) References Cited

U.S. PATENT DOCUMENTS

2005/0189765 A1* 9/2005 Maunder ............... F16L 33/225
                                                    285/305
2016/0178101 A1* 6/2016 Blake ................... F16L 33/225
                                                    29/428

* cited by examiner

JOINT ASSEMBLY

CROSS-REFERENCE TO RELATED APPLICATIONS

This non-provisional application claims priority under 35 U.S.C. § 119(a) on Patent Application No(s). 109209381 filed in Taiwan, R.O.C. on Jul. 22, 2020, the entire contents of which are hereby incorporated by reference.

TECHNICAL FIELD

The disclosure relates to joint assembly, more particularly to a joint assembly for fluid transfer applications.

BACKGROUND

A processor is typically disposed within an electronic device to execute various operations, such as data processing and analysis. A faster processor uses more energy and generates more heat, and thus requires a cooling solution to dissipate the generated heat, or the processor and other electrical devices around will be slowing down and overheating. It is known that liquid cooling is an appropriate solution for dissipating heat generated by high-speed processors compared to air cooling.

Generally, a liquid cooling system has a nozzle for receiving coolant. The caliber of the nozzle is proportional to the system's heat dissipation efficiency. Thus, when the processor has a higher cooling requirement, an easy way to adapt that is to change the nozzle with a bigger one. However, the removal and installation of nozzle are inconvenient and troublesome, and thus some users would rather replace the whole system. However, although the replacement of the small nozzle is avoided, the overall cost of a new system is higher.

SUMMARY

The disclosure provides a joint assembly allowing fast removal and replacement of nozzle.

One embodiment of this disclosure provides a joint assembly configured to be connected to a tube and including a first joint, a second joint and an engagement sleeve. The first joint has a channel and an engagement recess. The engagement recess is located in the channel of the first joint. The second joint has a first end, a second end and a channel. The second end is opposite to the first end. The channel of the second joint extends from the first end to the second end. The first end of the second joint is inserted into the tube. The engagement sleeve is sleeved on the tube. The tube is at least partially clamped by the engagement sleeve and the first end of the second joint. The engagement sleeve has an engagement structure located at an end of the engagement sleeve. The engagement structure of the engagement sleeve is engaged with the engagement recess of the first joint so that the second end of the second joint is bonded to the first joint. The channel of the first joint is in fluid communication with the channel of the second joint.

According to the joint assembly disclosed by the above embodiments, the second joint is engaged with the engagement recess of the first joint via the engagement structures, such that the second joint can be removed from or installed on the first joint in a fast and convenient manner.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
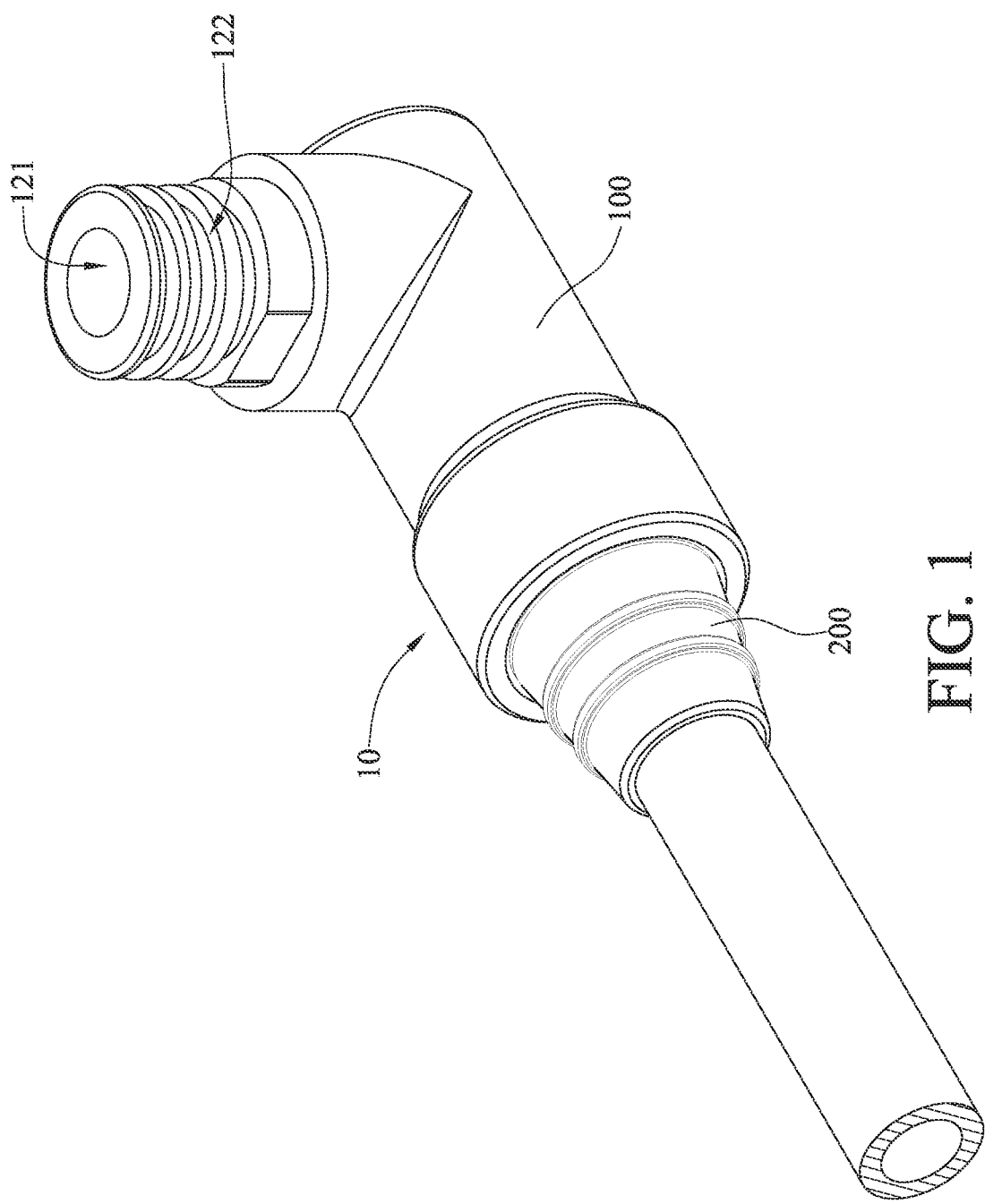
FIG. 1 is a perspective view of a joint assembly according to one embodiment of the disclosure and a tube.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
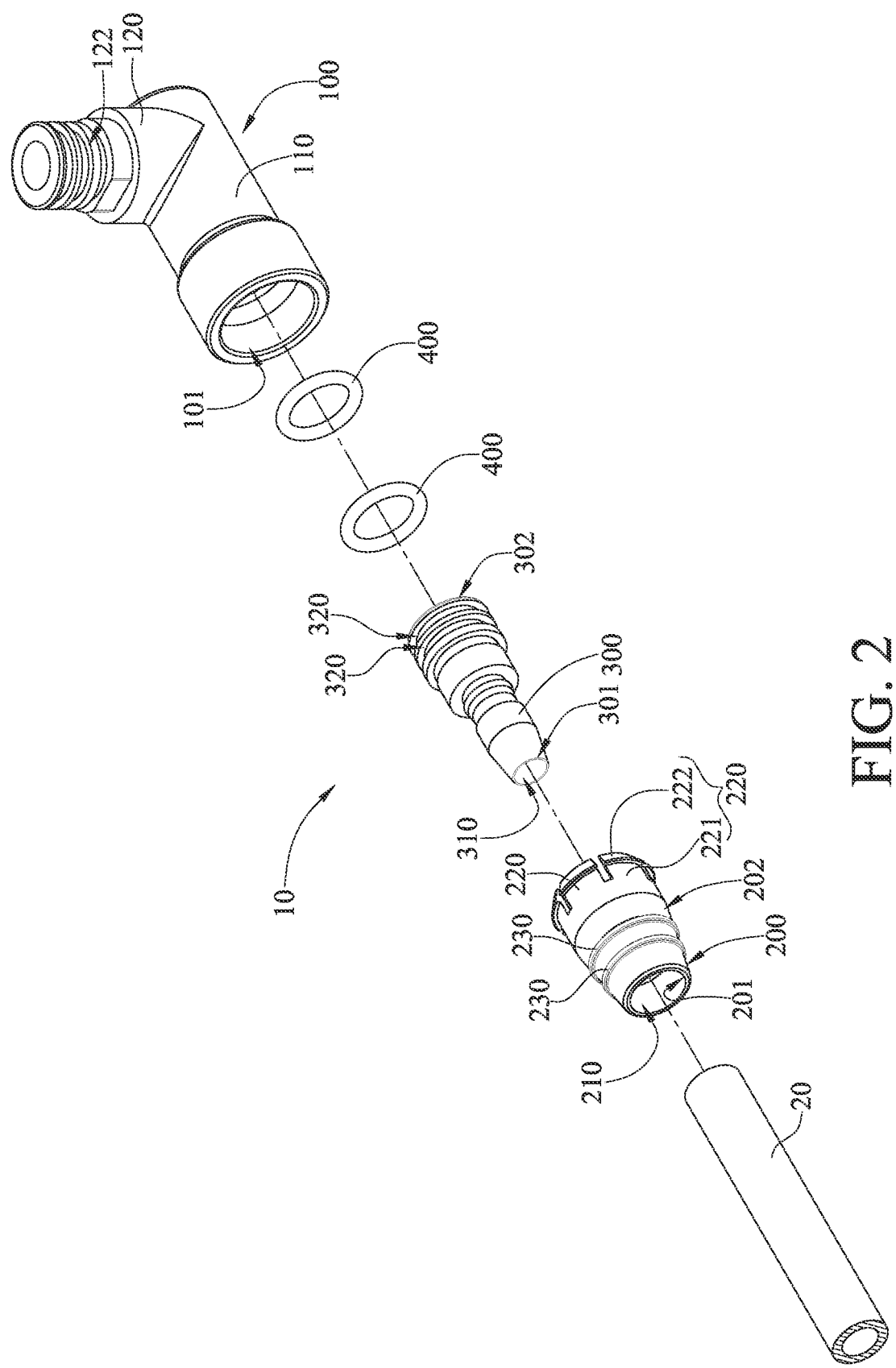
FIG. 2 is an exploded view of the joint assembly and the tube in FIG. 1.
Figure 3:
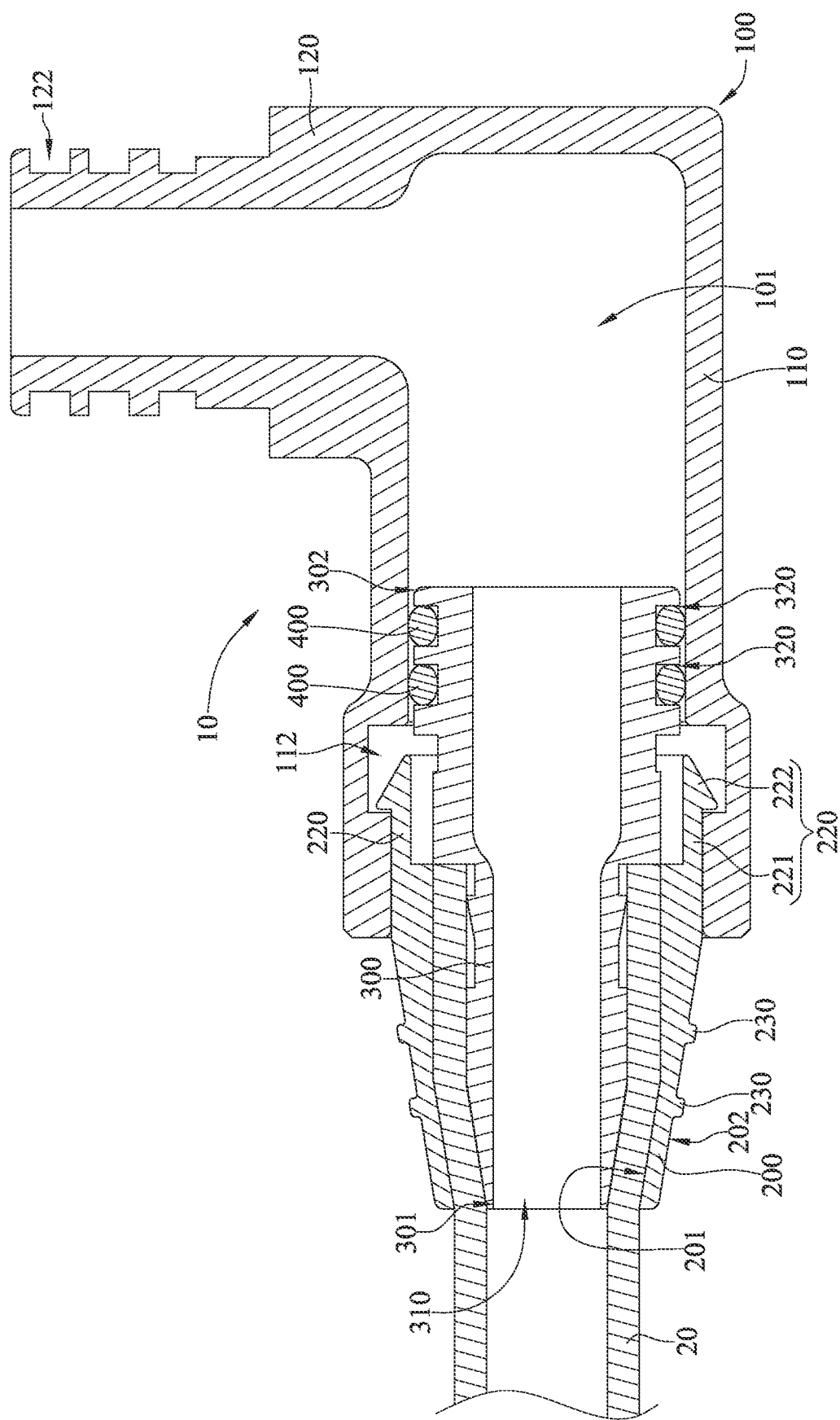
FIG. 3 is a cross-sectional view of the joint assembly and the tube in FIG. 1.

Please refer to FIGS. 1 to 3, where FIG. 1 is a perspective view of a joint assembly according to one embodiment of the disclosure and a tube, FIG. 2 is an exploded view of the joint assembly and the tube in FIG. 1, and FIG. 3 is a cross-sectional view of the joint assembly and the tube in FIG. 1.

This embodiment provides a joint assembly 10 configured to be connected to a tube 20 and including a first joint 100, a second joint 300, and an engagement sleeve 200.

The first joint 100 can be served as a tube elbow. As shown, the first joint 100 includes a first pipe part 110 and a second pipe part 120 that are connected to each other. The second pipe part 120 and the first pipe part 110 are substantially perpendicular to each other, that is, the angle between the second pipe part 120 and the first pipe part 110 is substantially 90 degrees but there might have an allowable manufacturing tolerance. The first joint 100 has a channel 101 penetrating through the first pipe part 110 and the second pipe part 120.

The first pipe part 110 has an engagement recess 112 located in the channel 101. The second pipe part 120 has a threaded structure 122 that is located outside the channel 101.

In this embodiment, the first pipe part 110 and the second pipe part 120 are substantially perpendicular to each other, but the disclosure is not limited thereto. In other embodiments, the first pipe part and the second pipe part may be parallel to each other or be at a suitable angle as required.

The second joint 300 is, for example, a water nozzle, and has a first end 301, a second end 302 and a channel 310. The second end 302 is opposite to the first end 301. The channel 310 extends from the first end 301 to the second end 302. The first end 301 of the second joint 300 is inserted into the tube 20. That is, a part the tube 20 surrounds the first end 301 of the second joint 300.

The engagement sleeve 200 is sleeved on an end of the tube 20. In detail, the engagement sleeve 200 has a through hole 210. The second joint 300 and the tube 20 are partially located in the through hole 210, allowing the engagement sleeve 200 to surround a part of the second joint 300 and a part of the tube 20 surrounding the second joint 300. In other words, the end of the tube 20 is clamped by the second joint 300 and the engagement sleeve 200. In addition, the tube 20 is, for example, flexible, and thus when the end of the tube 20 is clamped by the second joint 300 and the engagement sleeve 200, the tube 20 is squeezed by the second joint 300 and the engagement sleeve 200 and thus is deformed and flattened. In this way, the second joint 300, the engagement sleeve 200, and the tube 20 are tightly fixed to each other.

The engagement sleeve 200 has a plurality of engagement structures 220 located on an end thereof. Each engagement structure 220 includes a cantilever part 221 and an engagement part 222. In each engagement structure 220, the engagement part 222 is connected to a side of the cantilever part 221 and may swing relative to the first joint 100 via the elasticity of the cantilever part 221. The engagement parts 222 of the engagement structures 220 of the engagement sleeve 200 are engaged with the engagement recess 112 of the first joint 100, such that the second end 302 of the second joint 300 is fastened to the first joint 100 and the channel 101 of the first joint 100 is in fluid communication with the channel 310 of the second joint 300.

In this embodiment, there are a plurality of engagement structures 220, but the disclosure is not limited thereto. In other embodiments, there may be a single engagement structure. In addition, in this embodiment, there is a single engagement recess 112, but the disclosure is not limited thereto. In other embodiments, the quantity of the engagement recesses may be plural and equal to that of the engagement structures.

Furthermore, the engagement sleeve 200 further has an inner peripheral surface 201, an outer peripheral surface 202 and two anti-slip structures 230. The inner peripheral surface 201 is configured to press against the tube 20, the outer peripheral surface 202 faces away from the inner peripheral surface 201, and the anti-slip structures 230 are, for example, protrusions and are formed on the outer peripheral surface 202. The anti-slip structures 230 may be protrusions. The anti-slip structures 230 are configured to enhance the friction on the outer peripheral surface 202 of the engagement sleeve 200, thereby facilitating the installation of the engagement sleeve 200.

In this embodiment, the anti-slip structures 230 are two protrusions, but the disclosure is not limited thereto. In other embodiments, the anti-slip structure(s) may be a single recess, or may be three or more recesses.

In this embodiment, there are two peripheral recesses 320 recessed from the outside of the second end 302 of the second joint 300. The joint assembly 10 may further include two seal rings 400. The two seal rings 400 are respectively located in the two peripheral recesses 320 and are clamped by the first joint 100 and the second end 302 of the second joint 300.

In this embodiment, there are two peripheral recesses 320 and seal rings 400, but the disclosure is not limited thereto. In other embodiments, there may be a single peripheral recess and a single seal ring or there may be three or more peripheral recesses and seal rings.

Please refer to FIGS. 4 to 7 that are schematic views of an installation process of the joint assembly and the tube in FIG. 1.

Figure 4:
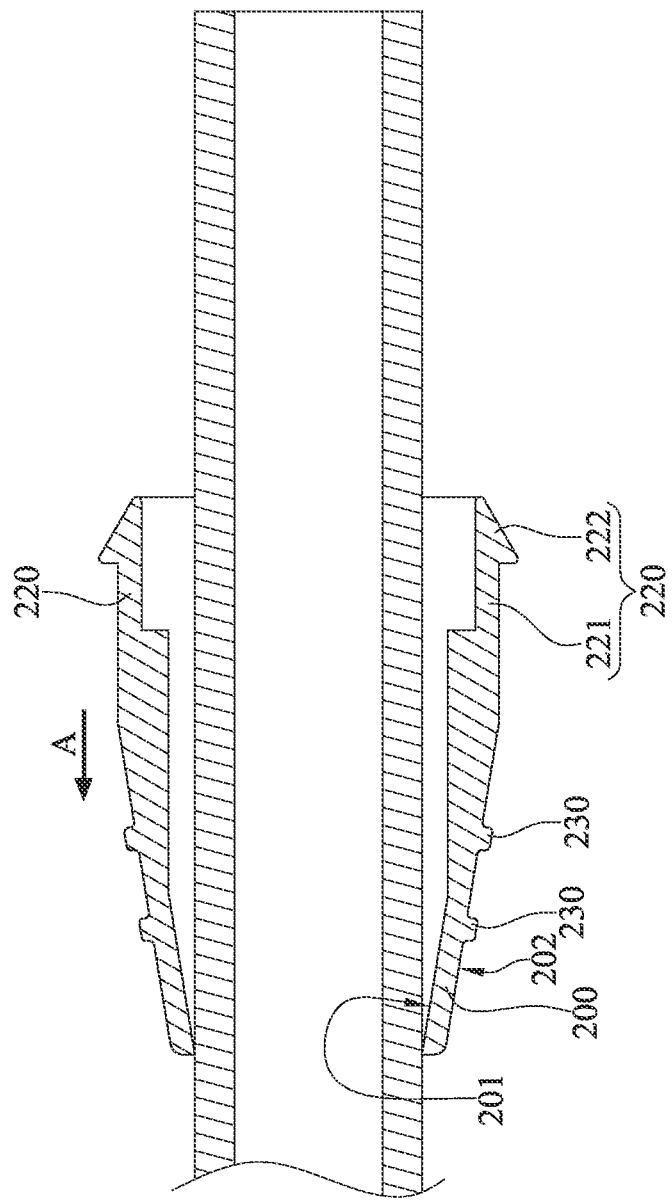
FIGS. 4 to 7 shows schematic views of an installation process of the joint assembly and the tube in FIG. 1.

As shown in FIG. 4, the first step is to sleeve the engagement sleeve 200 on the tube 20 along a direction A. Before the tube 20 is deformed, the engagement sleeve 200 and the tube 20 are in contact with each other in a loose manner, such that the relative position between the engagement sleeve 200 and the tube 20 may be easily adjusted.

Figure 5:
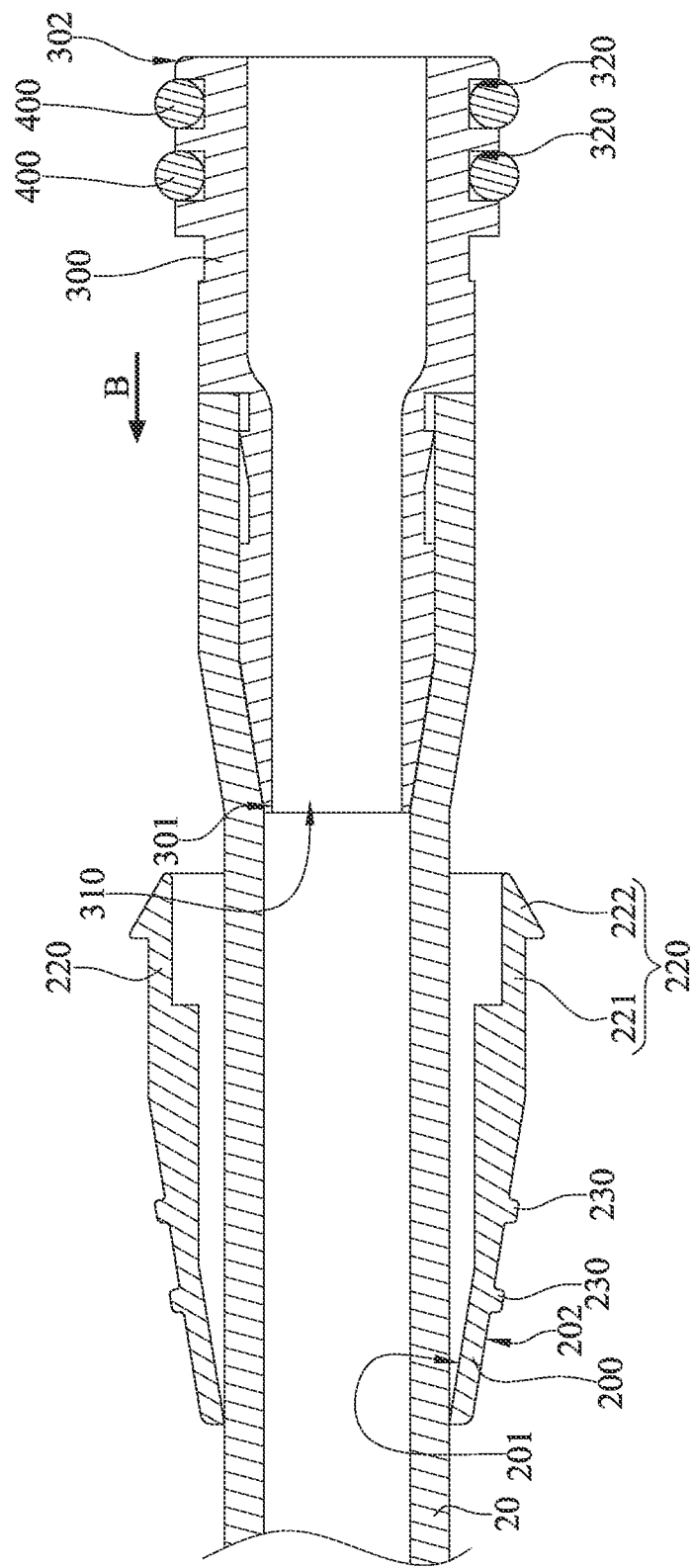

As shown in FIG. 5, the first end 301 of the second joint 300 is inserted into an end of the tube 20 along a direction B.

Figure 6:
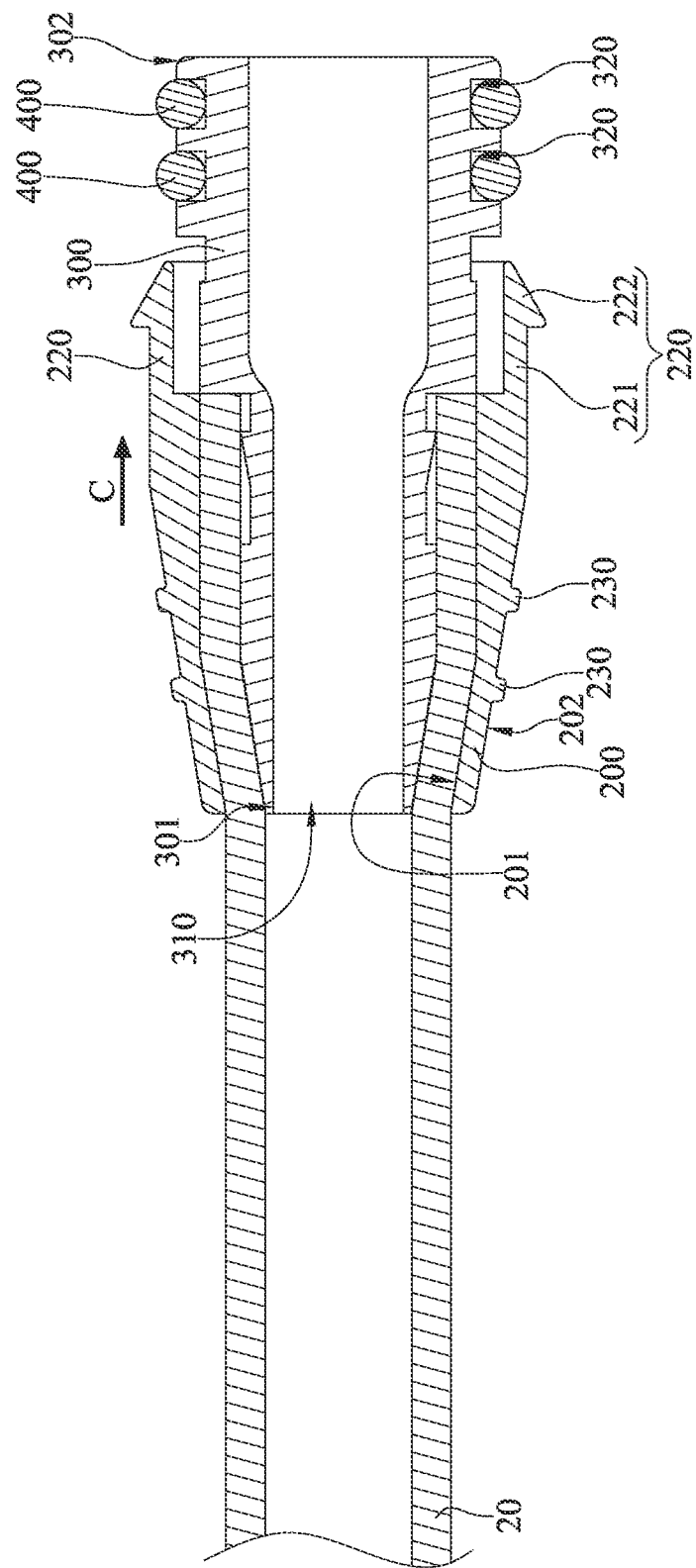

As shown in FIG. 6, the engagement sleeve 200 is moved to an end of the tube 20 where the second joint 300 is inserted along a direction C, and the end of the tube 20 is clamped by the second joint 300 and the engagement sleeve 200, thereby allowing the second joint 300, the engagement sleeve 200 and the tube 20 to be fixed to one another.

Figure 7:
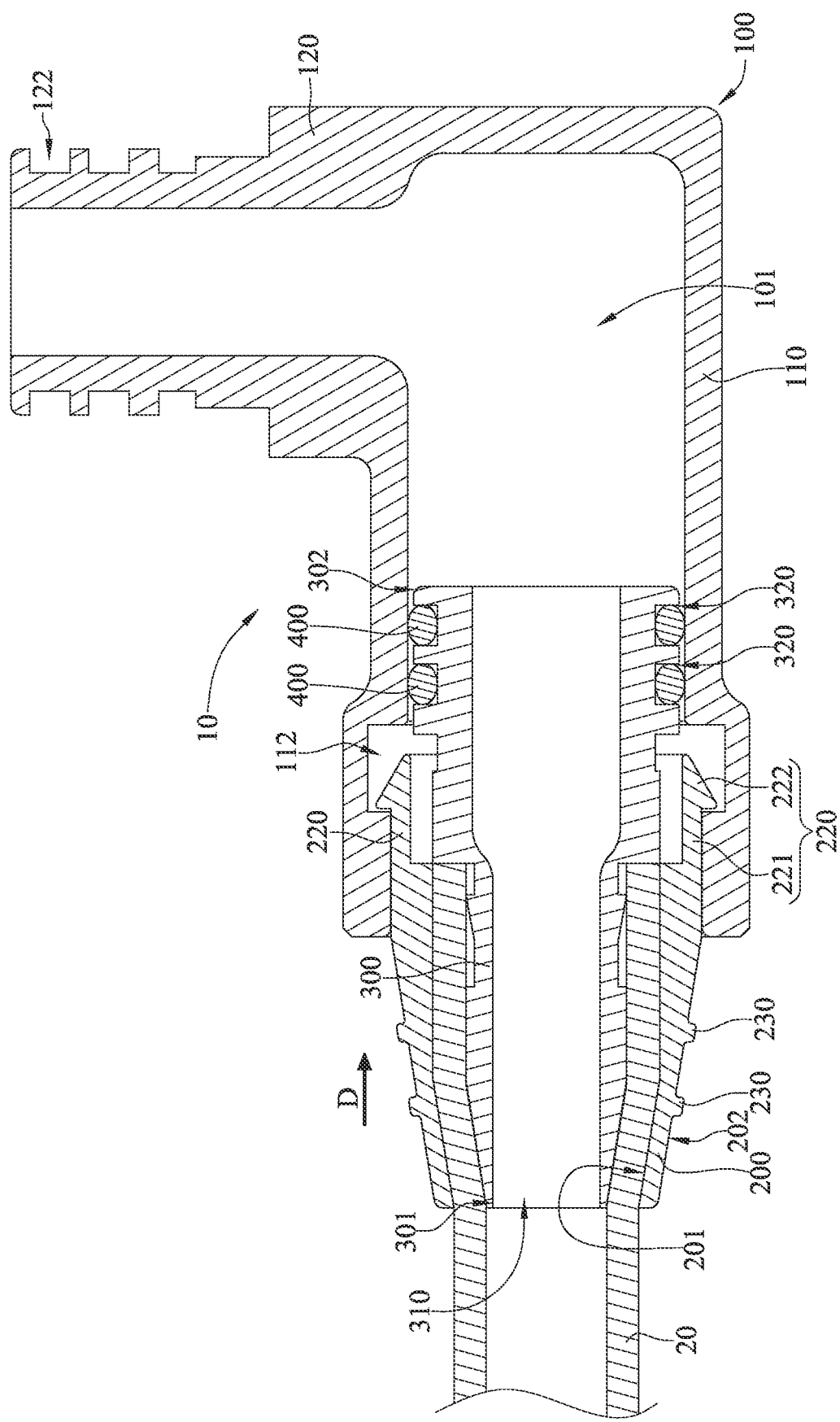

As shown in FIG. 7, the engagement parts 222 of the engagement structures 220 are engaged with the engagement recess 112 of the first joint 100 by moving the engagement sleeve 200 along a direction D, such that the second joint 300 is located in the channel 101 of the first joint 100 and the seal rings 400 press against an inner wall surface of the first joint 100 forming the channel 101, thereby completing the installation process of the joint assembly 10 and the tube 20. In this embodiment, when the engagement parts 222 of the engagement structures 220 of the engagement sleeve 200 is engaged with the engagement recess 112 of the first joint 100, the friction between the seal rings 400 and the inner wall surface of the first joint 100 provide a resistance to prevent the second joint 300 and the engagement sleeve 200 from being further proceeding along the direction D.

According to the joint assembly disclosed by the above embodiments, the second joint is engaged with the engagement recess of the first joint via the engagement structures, such that the second joint can be removed from or installed on the first joint in a fast and convenient manner.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A joint assembly, configured to be connected to a tube, the joint assembly comprising:
   a first joint, having a channel and an engagement recess, the engagement recess located in the channel of the first joint;
   a second joint, having a first end, a second end and a channel, wherein the second end is opposite to the first end, the channel of the second joint extends from the first end to the second end, the first end of the second joint is inserted into the tube; and
   an engagement sleeve, sleeved on the tube, wherein the tube is at least partially clamped by the engagement sleeve and the first end of the second joint, the engagement sleeve has an engagement structure located at an end of the engagement sleeve, the engagement structure of the engagement sleeve is engaged with the engagement recess of the first joint so that the second end of the second joint is bonded to the first joint, and the channel of the first joint is in fluid communication with the channel of the second joint;
   wherein the engagement structure has a locking surface locking the first joint, the second joint has a stopping surface stopping one end of the tube and the locking surface is closer to the second end of the second joint than the stopping surface and the entire engagement structure is separated from the second joint and the tube, and the engagement structure is movable relative to the second joint and a gap is located between the engagement structure and the second joint.

2. The joint assembly according to claim 1, wherein the first joint comprises a first pipe part and a second pipe part, the engagement recess is located on the first pipe part, the second pipe part has a threaded structure, the second pipe part and the first pipe part are connected and non-parallel to each other.

3. The joint assembly according to claim 2, wherein the first pipe part and the second pipe part are substantially perpendicular to each other.

4. The joint assembly according to claim 1, wherein the engagement sleeve further has an inner peripheral surface, an outer peripheral surface and an anti-slip structure, the inner peripheral surface is configured to press against the tube, the outer peripheral surface faces away from the inner peripheral surface, the anti-slip structure is located on the outer peripheral surface.

5. The joint assembly according to claim 1, wherein the engagement structure comprises a cantilever part and an engagement part, the engagement part is located on a side of the cantilever part so as to be allowed to move relative to the first joint via elasticity of the cantilever part.

6. The joint assembly according to claim 1, further comprising a seal ring, wherein the second joint further has a peripheral recess located on an outside of the second end, the seal ring is located in the peripheral recess and presses against the first joint.

* * * * *